(12) United States Patent
Enright et al.

(10) Patent No.: US 12,379,166 B2
(45) Date of Patent: Aug. 5, 2025

(54) THERMOSYPHON HEAT EXCHANGER APPARATUS WITH POROUS LAYER

(71) Applicant: Accelsius, LLC, Austin, TX (US)

(72) Inventors: Ryan Enright, Floral Park, NY (US); Raffaele Luca Amalfi, New Providence, NJ (US)

(73) Assignee: Accelsius, LLC, Austin, TX (US)

( * ) Notice: Subject to any disclaimer, the term of this patent is extended or adjusted under 35 U.S.C. 154(b) by 208 days.

(21) Appl. No.: 17/925,777

(22) PCT Filed: May 19, 2021

(86) PCT No.: PCT/EP2021/063262
§ 371 (c)(1),
(2) Date: Nov. 16, 2022

(87) PCT Pub. No.: WO2021/233983
PCT Pub. Date: Nov. 25, 2021

(65) Prior Publication Data
US 2023/0288147 A1    Sep. 14, 2023

(30) Foreign Application Priority Data
May 19, 2020   (EP) ..................................... 20175527

(51) Int. Cl.
*F28D 15/00*   (2006.01)
*F28D 15/02*   (2006.01)
*F28D 15/04*   (2006.01)

(52) U.S. Cl.
CPC ....... *F28D 15/0266* (2013.01); *F28D 15/043* (2013.01); *F28D 15/046* (2013.01); *F28F 2270/00* (2013.01)

(58) Field of Classification Search
CPC .. F28D 15/0266; F28D 15/043; F28D 15/046; F28D 15/0275; F28F 2270/00;
(Continued)

(56) References Cited

U.S. PATENT DOCUMENTS

| | | | |
|---|---|---|---|
| 6,330,907 B1 * | 12/2001 | Ogushi | ................ F28D 15/043 165/907 |
| 2003/0042009 A1 | 3/2003 | Phillips | |

(Continued)

FOREIGN PATENT DOCUMENTS

| | | |
|---|---|---|
| EP | 3098556 A1 | 11/2016 |
| WO | 2013023279 A1 | 2/2013 |
| WO | 2015014929 A1 | 2/2015 |

*Primary Examiner* — Travis Ruby
(74) *Attorney, Agent, or Firm* — Geoffrey Lottenberg; Berger Singerman LLP

(57) ABSTRACT

The application relates to a heat exchanger apparatus comprising: a channel for fluid flow extending between an inlet and an outlet; a porous layer dividing a first portion of the channel from a second portion of the channel, wherein the porous layer comprises a plurality of pores configured to enable fluid to be transferred from the first portion of the channel to the second portion of the channel; a plurality of evaporator structures located within the second portion of the channel wherein the evaporator structures comprise a wicking layer configured to enable evaporation of fluid from the surface of the evaporator structures; an ejector section configured to combine fluid from the first portion of the channel with fluid from the second portion of the channel and provide the combined fluid to the outlet.

13 Claims, 6 Drawing Sheets

Figure 1C:
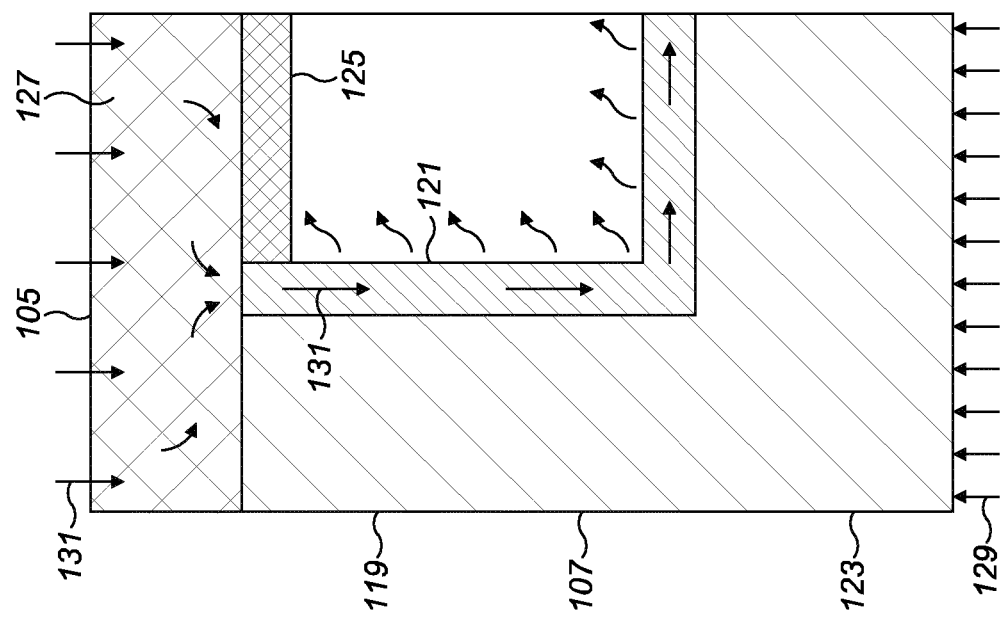

(58) Field of Classification Search
CPC . H05K 7/20336; H05K 7/20663–2069; H05K 7/208–20818
See application file for complete search history.

(56) References Cited

U.S. PATENT DOCUMENTS

| | | | |
|---|---|---|---|
| 2010/0132404 A1 | 6/2010 | Shuja | |
| 2013/0168057 A1* | 7/2013 | Semenic | B64G 1/50 165/104.21 |
| 2015/0305199 A1* | 10/2015 | Yu | F21V 29/00 165/104.21 |
| 2016/0131438 A1* | 5/2016 | De Troz | F28D 15/043 29/890.032 |
| 2016/0334170 A1* | 11/2016 | Grenz | F01N 5/02 |
| 2018/0120912 A1* | 5/2018 | Jenkins | F28D 15/0233 |
| 2018/0164040 A1* | 6/2018 | Kusano | F28D 15/043 |
| 2018/0209745 A1* | 7/2018 | Tsai | F28D 15/043 |
| 2020/0124354 A1 | 4/2020 | Dupont et al. | |
| 2020/0124355 A1* | 4/2020 | Gao | F28D 15/043 |
| 2021/0180874 A1* | 6/2021 | Eadelson | H01L 23/427 |

* cited by examiner

THERMOSYPHON HEAT EXCHANGER APPARATUS WITH POROUS LAYER

TECHNOLOGICAL FIELD

Examples of the present disclosure relate to heat exchanger apparatus and cooling systems comprising heat exchanger apparatus. Some relate to heat exchanger apparatus and cooling systems for use in cooling electronic apparatus.

BACKGROUND

Cooling systems for cooling electronic apparatus such as servers and data centers are known. These systems are configured to enable heat to be transferred away from parts of the apparatus that generate unwanted heat.

BRIEF SUMMARY

According to various, but not necessarily all, examples of the disclosure there is provided a heat exchanger apparatus comprising: a channel for fluid flow extending between an inlet and an outlet; a porous layer dividing a first portion of the channel from a second portion of the channel, wherein the porous layer comprises a plurality of pores configured to enable fluid to be transferred from the first portion of the channel to the second portion of the channel; a plurality of evaporator structures located within the second portion of the channel wherein the evaporator structures comprise a wicking layer configured to enable evaporation of fluid from the surface of the evaporator structures; an ejector section configured to combine fluid from the first portion of the channel with fluid from the second portion of the channel and provide the combined fluid to the outlet.

The porous layer may be provided overlaying at least a subset of the evaporator structures.

The porous layer may be configured to allow fluid to flow through the pores from the first portion of the channel to the second portion of the channel via capillary action.

The porous layer may comprise a thermally insulating material.

The porous layer may be coupled to the wicking layer of the evaporator structures so that fluid can flow from the porous layer into the wicking structure.

The wicking layer may comprise a plurality of capillary structures and the capillary structures have a smaller pore size than the pores in the porous layer.

The evaporation of fluid from evaporation structures may provide fluid in the second portion of the channel with a higher vapour content than fluid in the first portion of the channel.

The apparatus may be configured so that the second portion of the channel can be provided in proximity to a heat source so as to enable heat to be transferred from the heat source to fluid in the second portion of the channel via the evaporator structures.

The evaporator structures may comprise a plurality of fins that, at least partially, define flow paths through the second portion of the channel.

According to various, but not necessarily all, examples of the disclosure there is provided a cooling system comprising one or more heat exchangers as claimed in any preceding claim.

The cooling system may comprise one or more thermosyphon loops.

The cooling system may comprise one or more thermosyphon loop comprising a plurality of heat exchanger apparatus connected in series to cool a plurality of heat sources.

The cooling system may comprise one or more liquid accumulators.

BRIEF DESCRIPTION

Figure 1A:
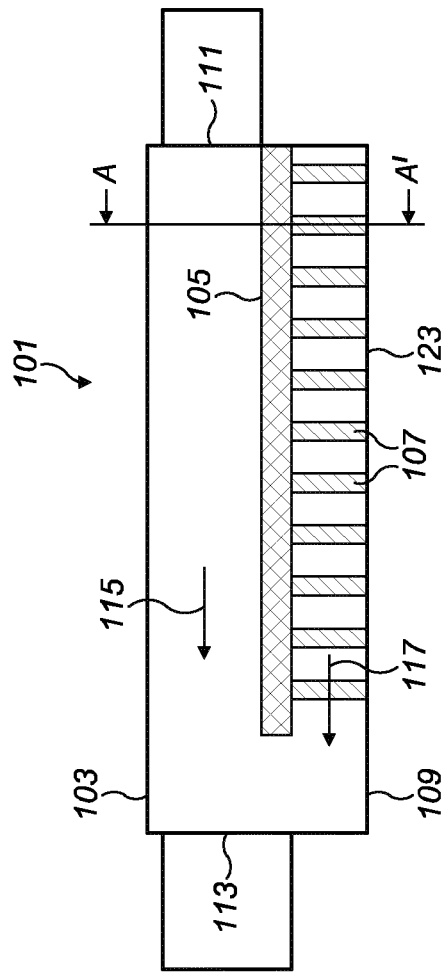
Figure 1B:
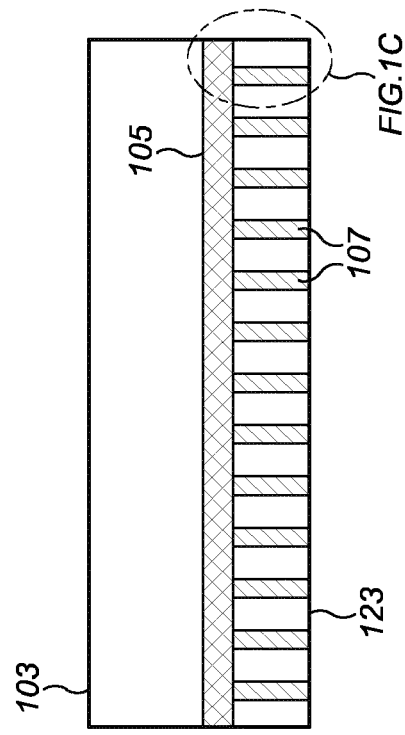
Figure 2A:
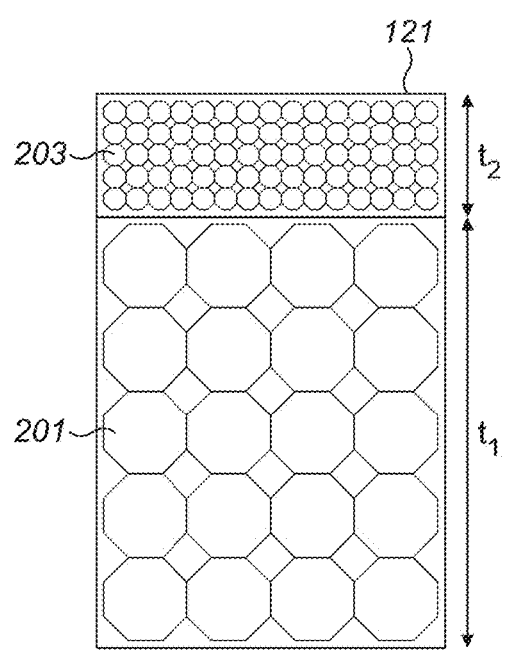
Figure 2B:
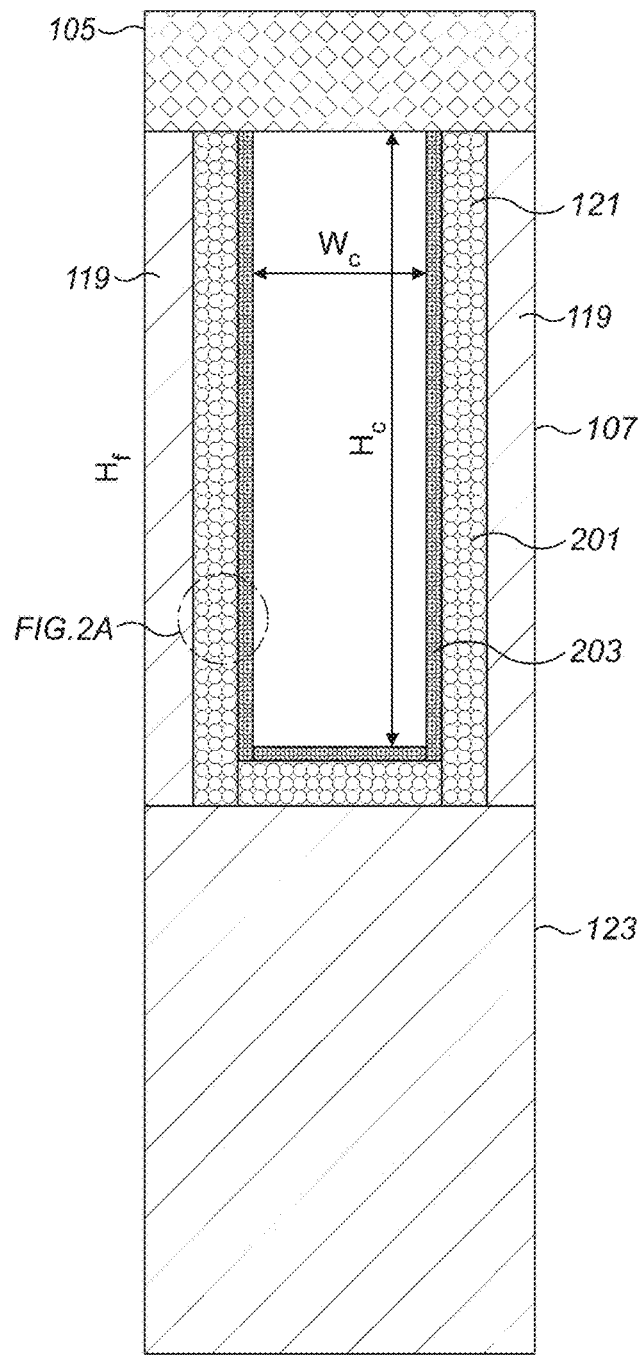
Figure 3:
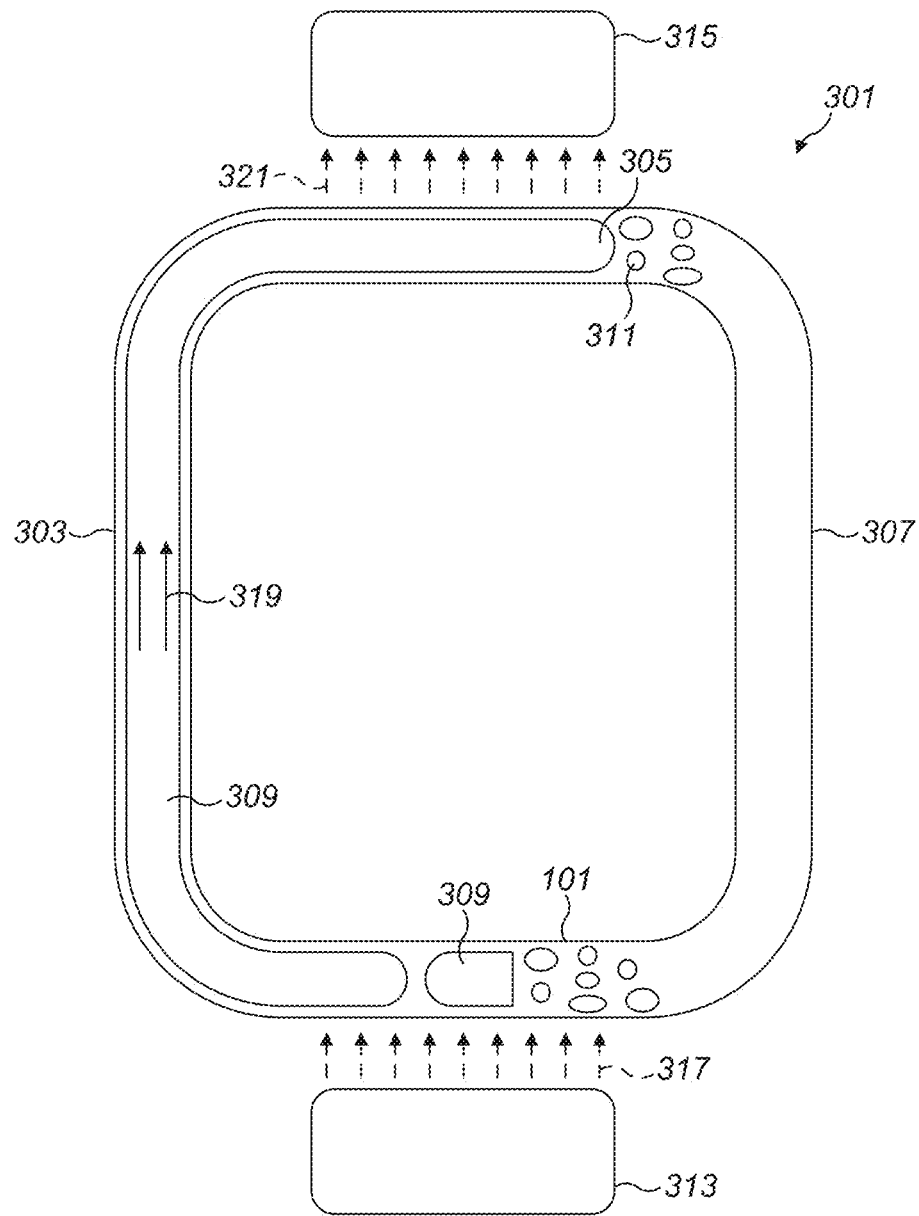
Figure 4A:
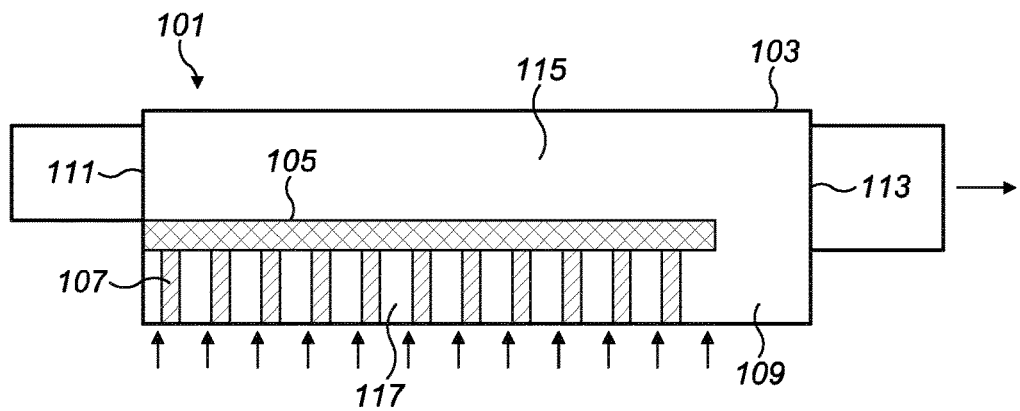
Figure 4B:
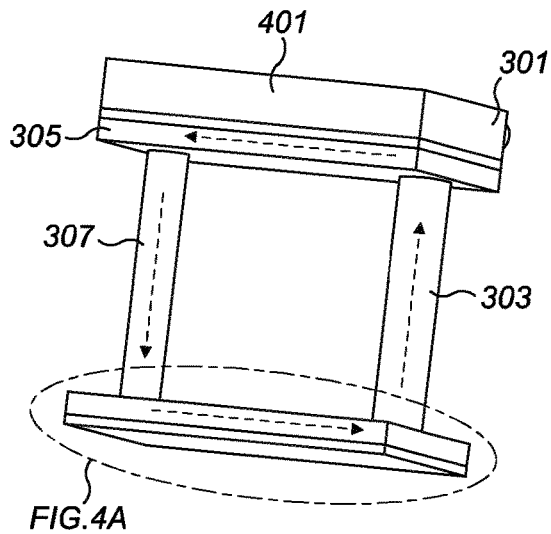
Figure 4C:
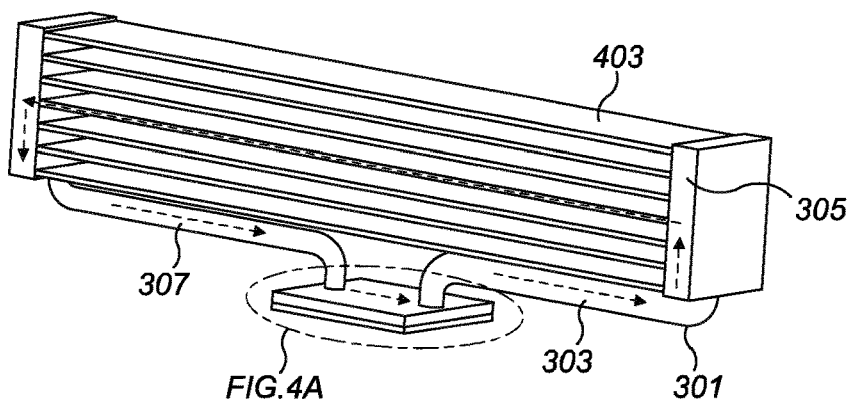
Figure 5:
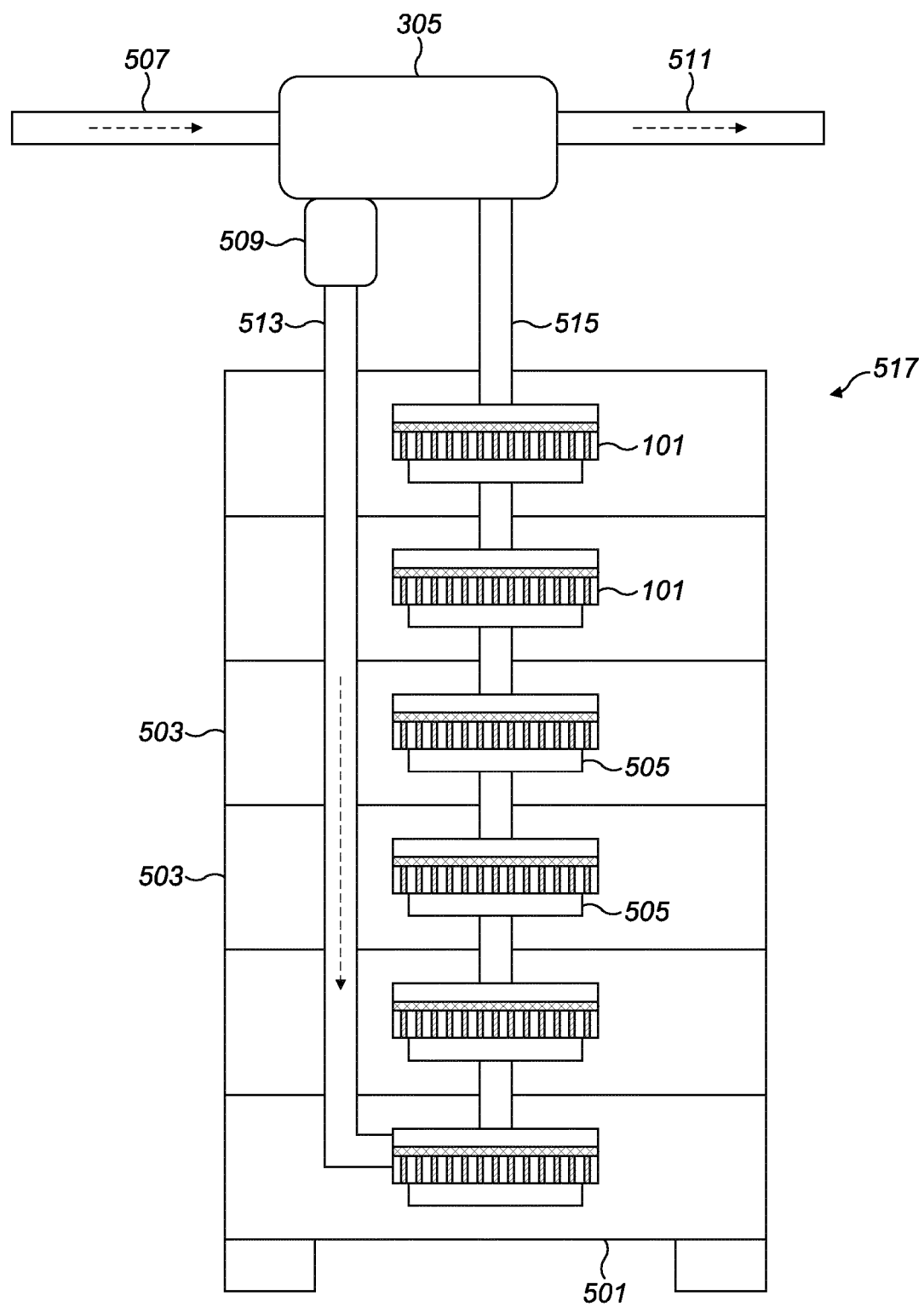
Figure 6:
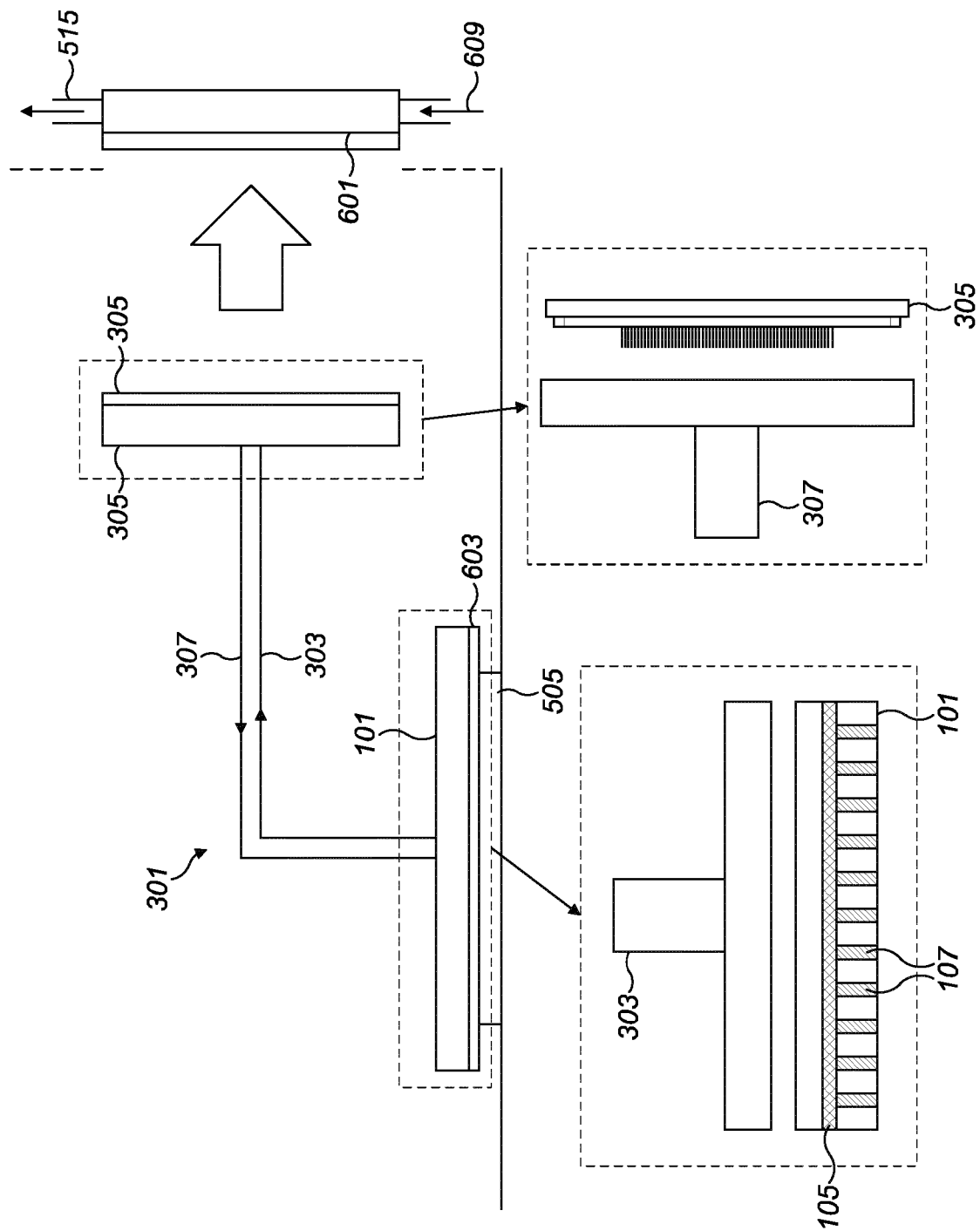

For a better understanding of various examples that are useful for a detailed description, reference will now be made by way of example only to the accompanying drawings in which:

FIGS. 1A to 1C illustrate a heat exchanger apparatus;
FIGS. 2A and 2B illustrate evaporator structures;
FIG. 3 illustrates a schematic of a cooling system;
FIGS. 4A to 4C illustrate example cooling systems;
FIG. 5 illustrates an example cooling system; and
FIG. 6 illustrates an example cooling system.

DETAILED DESCRIPTION

Examples of the disclosure relate to a heat exchanger apparatus 101 that can be used in cooling systems 301 to enable dissipation of high heat loads. The cooling systems 301 could be used to cool electronic apparatus such as servers, data centers or other types of apparatus that generate unwanted high heat loads during use.

FIGS. 1A to 1C schematically illustrate heat exchanger apparatus 101 according to examples of the disclosure.

The heat exchanger apparatus 101 is shown in FIG. 1A. The heat exchanger apparatus 101 comprises a channel 103, a porous layer 105, a plurality of evaporator structures 107 and an ejector section 109.

The channel 103 extends between an inlet 111 and an outlet 113. The channel 103 is configured to enable fluid to flow between the inlet 111 and the outlet 113. The size of the channel 103 can be of the order of several mm to several cm. For example, the channel 103 can have a length between 4 mm or 10 cm. The size of the channel 103 can be dependent on the application for which the heat exchanger apparatus 101 is being used. The size of the channel 103 will depend on factors such as the power dissipation that is required and the mass flow rate needed.

The diameter of the inlet 111 can be smaller than the diameter of the outlet 113 so as to balance the pressure drops within the channel 103 and ensure fluid can flow from the inlet 111 to the outlet 113.

The fluid provided to the inlet 111 can comprise any suitable working fluid that is configured to undergo a phase change from liquid to gas as it passes through the heat exchanger apparatus 101. The working fluid can be configured to undergo a partial phase change so that the amount of gas within the fluid increases between the inlet 111 and the outlet 113.

The channel 103 is divided into a first portion 115 and second portion 117 by the porous layer 105. The first portion 115 is coupled to the inlet 111 so that fluid can flow from the inlet 111 into the first portion 115 of the channel 103. The fluid in the first portion 115 is therefore cooler, liquid rich fluid.

The first portion 115 is provided above the second portion 117. The porous layer 105 is provided between the first portion 115 and the second portion 117. The porous layer 105 is configured to enable fluid to be transported from the first portion 115 to the second portion 117 but restrict heat being transferred from the second portion 117 to the first portion 115. The porous layer 105 can comprise a thermally insulating material. In some examples the porous layer 105 can comprise other materials in addition to a thermally insulating material. The porous layer 105 can comprise a thermally insulating material so that heat is not conducted from the first portion 115 to the second portion 117 via the porous layer 105.

The porous layer 105 comprises a plurality of pores that enables fluid from the first portion 115 of the channel 103 to be transported to the second portion 117 of the channel 103. The porous layer 105 is configured to enable fluid to be transported to the second portion 117 of the channel 103 via capillary action. The size of the pores in the porous layer 105 may be determined by the pore size of the wicking structure 121 in the second portion of the channel 103. The size of the pores in the porous layer 105 will be larger than or approximately equal to the pore size of the wicking structure 121 so that fluid can flow from a region that generates low capillary pressure to a region that generates a higher capillary pressure.

The plurality of evaporator structures 107 are provided in the second portion 117 of the channel 103. The plurality of evaporator structures 117 extend out of a wall 123 of the channel 103. The wall 123 can be coupled to a heat load. In the example shown in FIG. 1A the evaporator structures 107 have a rectangular cross section. It is to be appreciated that other shapes of evaporator structures 107 could be used in other examples of the disclosure.

In the example heat exchanger apparatus 101 in FIG. 1A the plurality of evaporator structures 107 comprises a plurality of fins 119 with a wicking structure 121 provided on the surface of the fins 119. The wicking structure 121 and fins 119 are shown in more detail in FIG. 1C.

The evaporator structures 107 at least partially, define a flow path through the second portion 117 of the channel 103. The evaporator structures 107 are configured with a large surface area so as to enable heat to be dissipated through the evaporator structures 107 to fluid passing through the second portion 117 of the channel 103.

The heat exchanger apparatus 101 comprises an ejector section 109 which is configured to combine fluid from the first portion 115 of the channel 103 with fluid from the second portion 117 of the channel 103 and provide the combined fluid to the outlet 113. The porous layer 105 is not provided in the ejector section 109. This enables the entrainment of vapor rich fluid from the second portion 117 of the channel 103 with liquid rich fluid from the first portion 115 of the channel 103. The ejector section 109 can comprise a nozzle or any other suitable means for controlling pressure within the channel 103 and directing fluid flow towards the outlet 113. The combined fluid can then be removed from the heat exchanger apparatus 101 via the outlet 113.

In the example shown in FIG. 1A there are no evaporator structures 107 provided in the ejector section 109. It is to be appreciated that in other examples of the disclosure some evaporator structures 107 could be provided within the ejector section 109.

FIG. 1B illustrates a cross section of the heat exchanger apparatus 101 through the line A-A' shown in FIG. 1A.

FIG. 1B shows that the plurality of evaporator structures 107 extend across the width of the channel 103. Spaces are provided between the evaporator structures 107 to enable fluid to flow through the second portion of the channel 103. It is to be appreciated that any suitable geometry of the evaporator structures 107 can be used. In some examples the evaporator structures 107 can comprise ridges that extend parallel to, or substantially parallel to, the flow of the working fluid. The evaporator structures 107 are arranged so that there is an exit path for fluid in the channel 103. In some examples the evaporator structures 107 can comprise an array of pillars or other similar structures.

The porous layer 105 is provided overlaying the evaporator structures 107 and also extends across the width of the channel 103. The porous layer 105 is provided overlaying the evaporator structures 107 so that the porous layer 105 is provided between at least a subset of the evaporator structures 107 and the first portion 115 of the channel 103. The porous layer 105 is provided above the evaporator structures 107 but below the first portion 115 of the channel 103.

FIG. 1C shows a section of the evaporator structures 107 and porous layer 105 in more detail. FIG. 1C shows the arrangement of the wicking structures 121 on the surface of the evaporator structures 107.

In this example the evaporator structures 107 comprise a plurality of fins 119 that extend out of the wall 123 of the channel 103. The fins 119 have rectangular cross sections. Other shapes of fins 119 can be provided in other examples of the disclosure.

The fins 119 can comprise any suitable thermally conductive material. The fins 119 can comprise the same material as the walls 123 of the channel 103.

The wicking structure 121 is provided on the surface of the fins 119 and is configured to enable fluid to be removed from the evaporator structures 107 by capillary action. In the example shown in FIG. 1A the wicking structure 121 is also provided on the wall 123 of the channel 103. The wicking structure 121 can comprise a mesh or other suitable structure which provides pores that enable the capillary action.

In some examples the wicking structure 121 can be formed using three dimensional printing, electrodeposition processes, sintering processes or any other suitable process. The process used to form the wicking structure 121 enables the size of the pores within the wicking structure 121 to be controlled. This size of the pores within the wicking structure 121 will affect the porosity of the wicking structure 121 and how efficiently the wicking structure 121 removes fluid from the evaporator structures 107.

The fins 119 and the wicking structures 121 can be made of any suitable material. The fins and the wicking structures 121 can be made of the same material or different materials. The fins 119 and the wicking structures 121 can be made of thermally conductive material, such as crystalline ceramics or metals such as copper, to enable heat to be transferred from the evaporator structures 107 to fluid passing through the wicking structures 121.

In the example shown in FIG. 1C the porous layer 105 is a heterogenous porous layer 105 that comprises pores of different sizes. In FIG. 1C the porous layer 105 comprises a first sub-layer 125 having a smaller pore size and a second sub-layer 127 having a larger pore size. The first sub-layer 125 is provided underneath the second sub-layer 127. The second sub-layer 127 provides, at least part of the boundary of the first portion 115 of the channel 103 and enables fluid to flow from the first portion 115 of the channel 103 into the porous layer 105. The first sub-layer 125 provides, at least part of the boundary of the second portion 117 of the channel 103 and enables fluid to flow from the porous layer 105 into the second portion 117 of the channel 103 but restricts fluid from flowing in the reverse direction, from the second portion 117 of the channel 103 back into the first portion 115 of the channel 103.

The porous layer 105 is provided overlaying the evaporator structures 107 so that the porous layer 105 is fluidically coupled to the wicking structure 121. This enables fluid from the first portion 115 of the channel 103 to flow through the porous structure 105 to the wicking structure 121 as indicated by the arrows 131. This enables the cooler fluid from the first portion 115 of the channel 103 to flow into the wicking structure 121 where the heat from the fins 119 causes fluid to evaporate. As fluid evaporates from the wicking structure 121 more fluid is drawn up from the porous layer 105 and through the wicking structure 121 via capillary action.

The wicking structure 121 can be configured so that the size of the pores within the wicking structure 121 is smaller than the size of the pores within the porous layer 105. This provides a higher capillary pressure within the wicking structure 121 which prevents fluid from being transferred back into the porous layer 105.

The evaporation of fluid from the wicking structures 121 creates a vapour rich fluid in the second portion of the channel 103.

When the heat exchanger apparatus 101 is in use heat is transferred from the heat source into the heat exchanger apparatus 101 through the walls 123 of the channel 103 as indicated by the arrows 129. Heat transfers through the thermally conductive material of the evaporator structure 107 to the wicking structure 121 on the surface of the fins 119. This heat causes the evaporation of fluid from the wicking structure 121 into fluid flow within the second portion 117 of the channel 103. This creates a vapour rich flow in the second portion 117 of the channel 103 that is hotter than the liquid rich flow in the first portion 115 of the channel 103.

FIG. 2A shows an example wicking structure 121 and FIG. 2B shows an evaporator structure 107 comprising the example wicking structure 121.

In the example of FIGS. 2A and 2B the wicking structure 121 comprises a heterogenous structure having two different pore sizes within the wicking structure 121. The wicking structure 121 comprises a first sub-layer 201 having a first pore size and a second sub-layer 203 having a second pore size where the second pore size is smaller than the first pore size. In some examples the second pore size can be smaller than the first pore size by a factor of about four. In some examples the pores in the first sub-layer 201 could have a diameter of 40 µm and the pores in the second sub-layer 203 could have a diameter of 10 µm. It is to be appreciated that different pore sizes and ratios of pore sizes could be used in other examples of the disclosure.

The second sub-layer 203 has the smaller pore size and forms the outer surface of the wicking structure 121. This ensures that evaporated fluid flows from the wicking structure 121 into the second portion 117 of the channel 103 of the heat exchanger apparatus 101.

In this example the first sub-layer 201 has a thickness that is several times greater than the thickness of the second sub-layer 203. In the example shown in FIG. 2A the first sub-layer 201 has a thickness of $t_1=0.2$ mm and the second sub-layer has a thickness of $t_2=0.05$ mm. It is to be appreciated that other thicknesses and ratios of thicknesses can be used in other examples of the disclosure.

FIG. 2B shows the heterogenous wicking structure 121 of FIG. 2A coupled to the fins 119 of the evaporator structures 107. In the example of FIG. 2B the wicking structure 121 is also provided on the wall 123 of the channel 103.

The porous layer 105 is provided overlaying the evaporator structures 107 so that fluid can flow from the porous layer 105 into the wicking structure 121. In the example shown in FIG. 2B the porous layer 105 has pores that have a larger size than the pores within the wicking structure 121. This ensures that fluid flows from the first portion 115 of the channel 103 though the porous layer 105 and into the wicking structure 121 and restricts fluid from flowing in the other direction.

In the example of FIG. 2A the porous layer 105 is a homogenous porous layer 105 and comprises a single section with a single pore size. It is to be appreciated that heterogenous porous layers 105 having different sections with different pore sizes could be used in some examples of the disclosure.

The fins 119 have a height of $H_f$. $H_f$ could be several mm. In some examples $H_f$ could be 2.5 mm. Other heights for the fins 119 could be used in other examples of the disclosure.

In the example shown in FIG. 2B the width between the wicking structures 121 of adjacent fins 119 is $W_c=0.6$ mm and the height of the gap between the wicking structure 121 on the wall of the channel 103 and the porous layer is 2.25 mm. It is to be appreciated that other dimensions for the fins 119 and spacing between the fins 119 could be used in other examples of the disclosure.

It is to be appreciated that a plurality of evaporator structures 107 as shown in FIG. 2B would be distributed throughout the channel 103. The evaporator structures 107 can be evenly distributed throughout the channel 103 so that the evaporator structures 107 are equally spaced from each other.

The thermal resistance $R_{HEx}$ of a heat exchanger apparatus 101 comprising a plurality of evaporator structures 107 as shown in FIG. 2B is given by $$R_{HEx} = \frac{h_{wick}^{-1} + (t_{wall}/k_{wall})}{L_c W_c}$$

Where $h_{wick}$ is the heat transfer coefficient of the wicking structure 121, $t_{wall}$ is the thickness of the wall 123 of the channel 103, $k_{wall}$ is the thermal conductivity of the wall 123, and $L_c$ and $W_c$ are the length and width of the channel 103.

The wicking structure 121 can handle heat fluxes in excess of 60 W/cm$^2$ so that for a channel 103 of width 40 mm and length 40 mm comprising evaporator structures 107 as shown in FIG. 2B the thermal resistance of the heat exchanger apparatus 101 can be of the order $R_{HEx}=0.01$ K/W. The values of the thermal resistance will depend on factors such as the materials used for the walls of the channel 103 and the evaporator structures 107 and the dimensions of the evaporator structures 107 and the wicking structure 121 and the working fluid.

FIG. 3 illustrates a schematic of a cooling system 301. FIG. 3 shows how the heat exchanger apparatus 101 can be integrated into a cooling system 301. In the example of FIG. 3 the cooling system 301 comprises a thermosyphon loop or a passive two-phase gravity driven system. The cooling system 301 comprises a heat exchanger apparatus 101, a riser 303, a condenser 305, and a downcomer 307.

The heat exchanger apparatus 101 can be as shown in FIGS. 1A to 2B and corresponding reference numerals are used for corresponding features. The cooling system 301 is configured so that the heat exchanger apparatus 101 is thermally coupled via a thermal interface material to a heat source 313 so that heat from the heat source 313 is transferred to the heat exchanger apparatus 101 as indicated by the arrows 317. The heat source 313 could be an electronic apparatus such as a server that generates unwanted heat during use.

The heat causes evaporation of fluid within the heat exchanger apparatus 101 and converts fluid from the liquid phase 311 into two phase fluid 309. The two-phase fluid 309 comprises a mixture of liquid and vapour.

The outlet 113 of the heat exchanger apparatus 101 is coupled to the riser 303 so that fluid from the ejector portion 109 of the heat exchanger apparatus 101 is provided to the riser 303. Fluid ejected from the heat exchanger apparatus 101 comprises the two-phase fluid 309 as it comprises the mixture of liquid and vapour from the heat exchanger apparatus 101. The vapour comprises evaporated gas from the evaporator structures 107.

The two phase fluid 309 rises up the riser 303 to the condenser 305 as indicated by the arrows 319. The condenser 305 is coupled to a coolant 315 so that heat is transferred from fluid in the condenser 305 to the coolant 315 as indicated by the arrows 321. This cools fluid in the vapour phase 309 so that the vapour is condensed back to the liquid phase 311. The condenser 305 could be a water-cooled condenser, an air cooled condenser or any other suitable type of condenser 305.

Fluid in the liquid phase 311 is then provided to the downcomer 307 where it is returned to the inlet 111 of the heat exchanger apparatus 101. The height of the downcomer 307 can be selected so that the static head of fluid within the downcomer 307 causes fluid to flow through the heat exchanger apparatus 101.

In some examples the cooling system 301 can also comprise a reservoir. The reservoir can be provided in the downcomer 307. The reservoir can be configured to store liquid and prevent fluid in the liquid phase 311 from entering the condenser 305 to avoid flooding of the condenser 305 that would result in a decrease in thermal performance.

FIGS. 4A to 4C illustrate how the heat exchanger apparatus 101 can be integrated into example cooling systems 301. FIG. 4A shows a heat exchanger apparatus 101 as shown in FIG. 1A and described above. Corresponding reference numerals are used for corresponding features. The heat exchanger apparatus 101 can be provided in the cooling systems 301 shown in FIGS. 4B and 4C.

FIG. 4B shows an example cooling system 301 comprising the heat exchanger apparatus 101. In the cooling system 301 of FIG. 4B the condenser 305 comprises a liquid-cooled condenser 401. The liquid-cooled condenser 401 is coupled to the heat exchanger apparatus 101 by a downcomer 307 and a riser 303 as shown in FIG. 3.

FIG. 4C shows another example cooling system 301 comprising the heat exchanger apparatus 101. In the cooling system 301 of FIG. 4C the condenser 305 comprises an air-cooled condenser 403. The air-cooled condenser 403 is coupled to the heat exchanger apparatus 101 by a downcomer 307 and a riser 303 as shown in FIG. 3.

FIG. 5 illustrates another example cooling system 517 comprising a thermosyphon loop 301 as shown in FIG. 3 with a plurality of heat exchanger apparatus 101 connected in series to cool a plurality of heat sources. The cooling system 517 of FIG. 5 could be used to cool electronic apparatus such as servers, datacentres or other similar types of apparatus.

The cooling system 517 of FIG. 5 is configured to cool a server rack 501 comprising a plurality of servers 503. Each of the servers 503 comprises a central processing unit (CPU) 505 that generates unwanted heat during use. In the example shown in FIG. 5 the server rack 501 comprises six servers 503. It is to be appreciated that this is an illustrative example and that other numbers of servers 503 could be provided in other examples of the disclosure.

The cooling system 517 comprises a plurality of heat exchanger apparatus 101. Each of the heat exchanger apparatus 101 can be provided in a thermosyphon loop 301 as shown in FIG. 3. In the example of FIG. 5 the cooling system 517 comprises at least one heat exchanger apparatus 101 for each of the servers 503 within the server rack 501. In the example of FIG. 5 the cooling system 301 comprises six heat exchanger apparatus 101 so that there is one heat exchanger apparatus 101 for each of the servers 503.

The heat exchanger apparatus 101 are thermally coupled to the CPUs 505 of the servers 503 via a thermal interface material so that heat from the CPU is transferred to the heat exchanger apparatus 101.

When the cooling system 301 is in use cold water 507, or other suitable fluid, is provided to the cooling system 301 to condense the two-phase fluid in the heat exchanger apparatus 101 back to liquid in the inlet channel 513. In the example of FIG. 5 a reservoir 509 is provided at the outlet of the condenser 305. The reservoir 509 can be configured to store liquid and prevent fluid in the liquid phase in the inlet channel 513 from entering the condenser 305 to avoid flooding, which would result in a decrease in thermal performance.

The plurality of heat exchanger apparatus 101 are configured to enable the working fluid of the thermosyphon loop 301 to be heated using heat from the CPUs 505 and any other suitable heat sources. This causes evaporation of the working fluid from liquid phase in the downcomer 513 to a mixture of liquid and vapour in the outlet channel 515. The two-phase fluid is condensed back to liquid by rejecting the heat to the water-side of the condenser 305.

The outlet channel 515 is coupled to the condenser 305 so that the two-phase fluid is condensed back to the liquid phase by the condenser 305. The condensed outlet water 511 will have a higher temperature than the inlet water 507 due to the heat exchanged with the thermosyphon working fluid. The condenser 305 can be an air-cooled condenser, a water-cooled condenser or any other suitable type of condenser.

FIG. 6 shows a thermosyphon loop 301 that can be provided within the cooling system 517 shown in FIG. 5. The thermosyphon loop 301 comprises a heat exchanger apparatus 101, a riser, 303, a condenser 305 and a downcomer 307 which can be as shown in FIG. 3.

The heat exchanger apparatus 101 comprises a porous layer 105 and a plurality of evaporator structures 107 which can be as described above. The heat exchanger apparatus 101 is coupled to a CPU 505 of a server 503. The heat exchanger apparatus 101 is coupled to the CPU 505 via a thermal interface material 603. The thermal interface material 603 comprises a material with high thermal conductivity so as to enable efficient heat transfer from the CPU 505 to the heat exchanger apparatus 101.

The condenser 305 of the thermosyphon loop 301 is coupled to the outlet channel 515 of the cooling system as shown in FIG. 5. The condenser 305 is coupled to the outlet channel via thermal interface material, 601. The thermal interface material, 601 comprises a reworkable material with high thermal conductivity so as to enable efficient heat transfer from the condenser 305 to fluid in the outlet channel 515. In this example the thermal interface material 601 is only provided on side of the condenser 305 that is coupled to the outlet channel. This enables the heat exchanger apparatus 101 to be removed from the cooling system 301 while the cooling system 301 is in use, so as to provide a hot-swappable system.

When the thermosyphon loop 301 is in use heat from the CPU 505 causes phase change of fluid within the heat exchanger apparatus 101 of the thermosyphon loop 301. Fluid in the two phase mixture is then provided to the condenser 305 where it is cooled by the water, or other fluid, passing through the outlet channel 515 as indicated by the arrows 609.

It is to be appreciated that the server CPU 505 can be one of a plurality of server CPUs 505 as shown in FIG. 5. Each of the server CPUs 505 can be thermally coupled to a different thermosyphon loop 301. Fluid in the outlet channel 515 can be used to sequentially cool fluid in the condensers 305 of the plurality of thermosyphon loops 301.

In the example of FIG. 6 the thermosyphon loop 301 and the thermal interface materials 603, 601 provide a closed loop. This enables each of the thermosyphon loops 301 within the cooling system 517 to be independent of the other thermosyphon loops 301 within the cooling system 517. This can enable the thermosyphon loops 301 to be removed and exchanged while the server rack and cooling system 517 are in use, thereby providing a hot-swappable modular cooling system 517. This also reduces the risk of damage that could be caused by failure of any of the independent thermosyphon loops 301.

In some examples the water or other fluid in the outlet of the condenser that is heated by plurality of thermosyphon loops 301 can be extracted from the cooling system 517 and used to provide heat to a heating network or for improving energy efficiency of a power source.

In this description the term coupled means operationally coupled and any number or combination of intervening elements can be provided between coupled components including no intervening elements.

The term "comprise" is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims. For example. FIG. 3 shows the heat exchanger apparatus 101 in a passive cooling system 301. It is to be appreciated that the heat exchanger apparatus 101 can be also implemented in a cooling system comprising one or more pumps. In such examples one or more pumps and condenser can be located in a dedicated space at the bottom of a server rack or other electronic device that requires cooling.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. A heat exchanger apparatus comprising:
   a channel for fluid flow extending between an inlet and an outlet;
   a porous layer dividing a first portion of the channel from a second portion of the channel, wherein the porous layer comprises a plurality of capillary pores configured to enable fluid to be transferred from the first portion of the channel to the second portion of the channel;
   a plurality of evaporator structures located within the second portion of the channel wherein the evaporator structures comprise a wicking layer configured to enable evaporation of fluid from the surface of the evaporator structures; and
   an ejector section configured to combine fluid from the first portion of the channel with fluid from the second portion of the channel and provide the combined fluid to the outlet.

2. The heat exchanger of claim 1, wherein the porous layer is provided overlaying at least a subset of the evaporator structures.

3. The heat exchanger of claim 1, wherein the porous layer is configured to allow fluid to flow through the capillary pores from the first portion of the channel to the second portion of the channel via capillary action.

4. The heat exchanger of claim 1, wherein the porous layer comprises a thermally insulating material.

5. The heat exchanger of claim 1, wherein the porous layer is coupled to the wicking layer of the evaporator structures so that fluid can flow from the porous layer into the wicking structure.

6. The heat exchanger of claim 1, wherein the wicking layer comprises a plurality of capillary structures and the capillary structures have a smaller pore size than the capillary pores in the porous layer.

7. The heat exchanger of claim 1, wherein the evaporation of fluid from evaporation structures provides fluid in the second portion of the channel with a higher vapour content than fluid in the first portion of the channel.

8. The heat exchanger of claim 1, wherein the apparatus is configured so that the second portion of the channel can be provided in proximity to a heat source so as to enable heat to be transferred from the heat source to fluid in the second portion of the channel via the evaporator structures.

9. The heat exchanger of claim 1, wherein the evaporator structures comprise a plurality of fins that, at least partially, define flow paths through the second portion of the channel.

10. A cooling system comprising one or more heat exchangers, the at least one or more heat exchangers comprising:

a channel for fluid flow extending between an inlet and an outlet;

a porous layer dividing a first portion of the channel from a second portion of the channel, wherein the porous layer comprises a plurality of capillary pores configured to enable fluid to be transferred from the first portion of the channel to the second portion of the channel;

a plurality of evaporator structures located within the second portion of the channel wherein the evaporator structures comprise a wicking layer configured to enable evaporation of fluid from the surface of the evaporator structures; and an ejector section configured to combine fluid from the first portion of the channel with fluid from the second portion of the channel and provide the combined fluid to the outlet.

11. The cooling system of claim 10, wherein the cooling system comprises one or more thermosyphon loops.

12. The cooling system of claim 11, wherein the one or more thermosyphon loops comprises a plurality of heat exchanger apparatus connected in series to cool a plurality of heat sources.

13. The cooling system of claim 12, comprising one or more liquid accumulators.

\* \* \* \* \*